United States Patent [19]

Brower

[11] 4,212,684
[45] Jul. 15, 1980

[54] CISFET PROCESSING INCLUDING SIMULTANEOUS DOPING OF SILICON COMPONENTS AND FET CHANNELS

[75] Inventor: Ronald W. Brower, Dayton, Ohio
[73] Assignee: NCR Corporation, Dayton, Ohio
[21] Appl. No.: 962,423
[22] Filed: Nov. 20, 1978
[51] Int. Cl.$^2$ .................. H01L 29/78; H01L 21/96; B01J 17/00; H01L 11/14
[52] U.S. Cl. ........................ 148/1.5; 29/571; 148/187; 357/23; 357/41; 357/59; 357/91
[58] Field of Search ............... 148/1.5, 187; 357/23, 357/41, 91, 59; 29/571

[56] References Cited
U.S. PATENT DOCUMENTS

| | | | |
|---|---|---|---|
| 3,750,268 | 8/1973 | Wang | 29/571 |
| 3,868,274 | 2/1975 | Hubar et al. | 148/1.5 |
| 3,889,358 | 6/1975 | Bierhenke | 29/571 |
| 3,897,282 | 7/1975 | White | 148/175 |
| 3,996,657 | 12/1976 | Simko et al. | 29/571 |
| 4,041,522 | 8/1977 | Oguey et al. | 357/42 |
| 4,074,301 | 2/1978 | Paivinen et al. | 357/23 |
| 4,075,045 | 2/1978 | Rideout | 148/187 |
| 4,080,718 | 3/1978 | Richman | 29/571 |
| 4,095,251 | 6/1978 | Dennard | 357/23 |
| 4,101,921 | 7/1978 | Shimada et al. | 357/23 |
| 4,104,784 | 8/1978 | Klein | 29/571 |
| 4,110,776 | 8/1978 | Rao et al. | 357/23 |

OTHER PUBLICATIONS

Tsuchimoto et al., "Ion Impl$^n$ . . . Polycrystalline Si", Ion Implantation in Semiconductors, Ed. Namba, Plenum, New York, 1974.

Primary Examiner—L. Dewayne Rutledge
Assistant Examiner—Roy Upendra
Attorney, Agent, or Firm—J. T. Cavender; Philip A. Dalton

[57] ABSTRACT

A process for forming a CIS (conductor-insulator-semiconductor) integrated circuit having one or more field-effect memory transistors, and one or more polysilicon resistors and/or polysilicon conductors. The polysilicon components are formed to predetermined sizes, as needed, so that the implant used to establish the memory threshold voltage of the transistor also provides the desired polysilicon resistance value(s). The process may be used to simultaneously form both memory and non-memory transistors.

12 Claims, 13 Drawing Figures

METALLIZATION

MEMORY IMPLANT

FIG. 1 FORM SOURCE & DRAIN

FIG. 2 IMPLANT FIELD

FIG. 3 IMPLANT CHANNEL

FIG. 4

FORM FIELD OXIDE

FIG. 5

FORM POLYSILICON & OXIDE

FIG. 6

FORM MASK

FIG. 7 PATTERN POLYSILICON

FIG. 8 REMOVE MASK

FIG. 9 FORM CUTS

FIG. 12  FORM OXIDE, NITRIDE & CUTS

FIG. 13  METALLIZATION

CISFET PROCESSING INCLUDING SIMULTANEOUS DOPING OF SILICON COMPONENTS AND FET CHANNELS

BACKGROUND OF THE INVENTION

The invention relates to CIS technology, and, more particularly, to processes for forming CIS integrated circuits which utilize field effect transistors (FETs) and passive polysilicon components.

The cost and time required to fabricate CIS microelectric circuits is related directly to the number of masking steps. Unfortunately, when polysilicon resistors or conductors are used in such circuits, separate masking (and doping) sequences are used to establish the threshold voltage of the field-effect transistors and the resistance of the polysilicon. It is desirable to reduce the number of such steps, for example, by combining the separate masking steps.

The prior art teaches doping one or more active and/or passive circuit components using a single doping step. For example, U.S. Pat. No. 4,075,045 issued Feb. 21, 1978, to Rideout, uses the source and drain diffusion process to simultaneously form a substrate capacitor electrode. U.S. Pat. No. 3,889,358, issued June 17, 1975, to Bierhenke, tailors the threshold voltage of an FET and the resistance of a substrate load resistor of an inverter circuit by simultaneous doping. The resistance of the resistor can vary widely, without any serious effect on the performance of the circuit. Thus, the impurity concentration resulting from the doping is unimportant.

U.S. Pat. No. 3,996,657 issued Dec. 14, 1976 to Simko relates to a floating gate, avalanche injected, MOS (metal oxide semiconductor) structure and to a process for doping the source and drain simultaneously with the doping of the polysilicon floating gate or the polysilicon control gate. Simultaneous doping apparently is possible between the doping level for the gate can vary widely, or because the gate has the same doping level requirements as the source and drain.

In U.S. Pat. No. 4,080,718 issued Mar. 28, 1978 to Richman, an FET channel is doped by implantation through a polysilicon gate, which is doped incidentally to the channel doping. In U.S. Pat. No. 3,750,268, issued Sept. 10, 1971 to Wang, source and drain electrodes are apparently doped incidentally to the process of establishing ohmic contact between the source and drain and their respective electrodes.

It is apparent that simultaneous doping of field-effect transistors and polysilicon conductors or resistors to establish the threshold voltage and to establish the conductance or resistance of the polysilicon is highly desirable to the aim of reducing masking steps and, therefore, production costs. It is also apparent that the above patents have achieved advances in the use of implantation and diffusion during MOSFET processing. These patents indicate that various substrate components can be doped simultaneously, and that, where the precise resistance of polysilicon is unimportant, polysilicon components can be doped as a by-product of forming other components. However, these patents provide no suggestion for achieving simultaneous doping of active devices and polysilicon components when the resistance of the polysilicon must be controlled relatively precisely.

CROSS-REFERENCE TO RELATED APPLICATION

This application is related to U.S. Ser. No. 962,422 (NCR docket 2778), which discloses a process using a simultaneous channel-polysilicon implant to form non-memory CISFETS.

SUMMARY OF THE INVENTION

The present invention relates to a process for forming CISFET integrated circuits which utilize memory FETs and polysilicon passive components. The process is tailored to permit simultaneous doping of the memory FET and the polysilicon components. After partially forming the integrated circuit by forming a source and drain in a semiconductor substrate, a first implant is made in the channel of the FET; a field oxide layer is formed over the substrate; one or more polysilicon components are formed on the field oxide with the size of the components being selected to provide a predetermined resistance for a given impurity concentration; an aperture is formed in the field oxide to define the channel of the FET; a relatively thick, non-memory gate insulator is formed on the substrate within the channel aperture; and, a second implant is made, in the memory section of the FET channel and in the polysilicon to adjust the threshold voltage of the memory section and to provide the given, resistance-determining impurity concentration in the polysilicon components, respectively. A relatively thin, memory gate insulator is then formed over the memory section of the channel, and additional gate insulator layers are provided, as required, prior to forming the gate electrode.

The process forms non-memory FETs simultaneously with memory FETs by using the first implant to establish a base impurity concentration in the channels of both the memory and the non-memory FETs. The base concentration is tailored to provide the desired threshold voltage of the non-memory FET. The second implant is then made in only the memory FET and in the polysilicon to establish the memory threshold and the polysilicon resistance.

DETAILED DESCRIPTION

Figure 13:
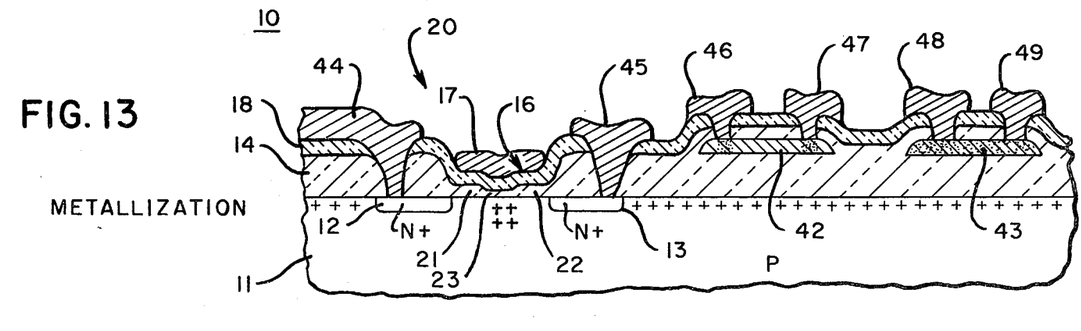

FIG. 13 is a partial cross-sectional view of a CIS integrated circuit 10 formed according to the present invention. The view is parallel to the channel of memory MNOSFET 20. As used here, the term CIS is generic to such structure types as SOS (silicone oxide semiconductor) MOS (metal oxide semiconductor), SNOS (silicon nitride oxide semiconductor) and MNOS (metal nitride oxide semiconductor). The exemplary integrated circuit 10 is N-channel MNOS. The invention is applicable to P-channel also.

The circuit 10 comprises a semiconductor substrate 11 of one conductivity type (illustratively, P-type) within which spaced-apart surface-adjacent regions of the opposite conductivity type (N-type) form source 12 and drain 13 of MNOSFET 20. A thick insulating layer 14 typically of silicon dioxide is formed on the substrate 11 for electrically isolating the components of the circuit 10. The FET 20 includes a gate structure comprising a dual layer insulator 16 and a gate electrode 17 which overlie the channel region between the source 12 and the drain 13.

The dual insulator comprises a silicon dioxide layer 21, 22, 23 and silicon nitride layer 18. The exemplary silicon dioxide gate insulator has relatively thick regions 21 and 22 (for example, 500 to 600 Angstroms, 0.05 to 0.06 microns) adjacent to the source and/or drain, and a relatively thin memory gate section 23 (10 to 60 Angstroms, 0.001 to 0.006 microns), thus providing the source-protected and/or drain-protected split-gate or trigate memory structure taught in U.S. Pat. No. 3,719,866. This patent, which issued Mar. 6, 1973 to Naber and Lockwood, is assigned to the assignee of the present invention and is incorporated by reference.

The integrated circuit 10 may include polysilicon components such as conductor 43 for interconnecting various circuit elements, and polysilicon resistors such as 42. (Although "conductor" and "resistor" are used separately herein, it is to be understood that "components" includes both low resistance components, i.e., conductors and relatively high resistance components, i.e., resistors. Also, the plural "components" includes the singular "component", and vice versa.) Metal electrodes 44 and 45, 46 and 47, and 48 and 49 provide electrical connection to the source 12 and drain 13, the contact regions of the polysilicon resistor 42, and the contact regions of the polysilicon conductor 43, respectively.

Those skilled in the art will understand that the FIG. 13 structural arrangement is chosen merely to facilitate description: for example, contact usually is made to a single point along each of a pair of diffusion stripes which comprise the source and drain and at various points along a network of conductors and resistors. Also, a passivation layer or layers (not shown) can be formed over the circuit 10.

The present invention relates to a process for forming integrated circuits such as MNOS circuit 10 and, more particularly, to a process for forming such circuits which involves a single mask deposition sequence to establish the threshold of memory FETs or of the memory section of FETs such as 20, and the resistance (conductance) of polysilicon conductors such as 43, polysilicon resistors such as 42 and the contact regions thereof.

The Table summarizes the steps of an exemplary process which utilizes the single mask deposition sequence, and relates the steps to the corresponding figures of the drawing.

TABLE

| Step | Figure | Description |
|---|---|---|
| 1 | 1 | Source and drain formation. |
| 1.1 | | Grow or deposit implant or diffusion masking oxide layer 24. |
| 1.2 | | Delineate photoresist mask. |
| 1.3 | | Form oxide mask 24. |
| 1.4 | | Remove photoresist mask. |
| 1.5 | | Deposit or implant source 12 and drain 13. |
| 1.6 | | Remove oxide mask 24. |
| 2 | 2 | Field implant. |
| 2.1 | | Grow or deposit implant masking oxide layer 28. |
| 2.2 | | Delineate channel photoresist mask 29. |
| 2.3 | | Implant field. |
| 2.4 | | Remove photoresist mask 29. |
| 3 | 3 | Enhancement (channel) implant. |
| 3.1 | | Implant channel 25. |
| 3.2 | | Remove oxide layer 28. |
| 4 | 4 | Deposit or grow field oxide layer 14. |
| 5 | 5-7 | Polysilicon component formation. |

TABLE-continued

| Step | Figure | Description |
|---|---|---|
| 5.1 | 5 | Form polysilicon layer 31. |
| 5.2 | | Deposit or grow oxide layer 32. |
| 5.3 | | Delineate photoresist mask 33. |
| 5.4 | 6 | Pattern oxide mask 32. |
| 5.5 | | Remove photoresist mask 33. |
| 5.6 | 7 | Pattern polysilicon conductors/resistors. |
| 5.7 | 8 | Remove oxide mask 32. |
| 6 | 9 | Develop source contact cut, gate cut and drain contact cut 36, 37, 38. |
| 6.1 | | Delineate photoresist mask. |
| 6.2 | | Etch field oxide 14 via mask. |
| 7 | 10 | Form gate oxide 39. |
| 8 | 11 | Memory gate and polysilicon implant. |
| 8.1 | | Delineate photoresist mask 40. |
| 8.2 | 11 | Etch oxide 39, 39R, 39C as needed. |
| 8.3 | | Memory gate and polysilicon implant. |
| 8.4 | | Remove photoresist. |
| 9 | 12 | Form memory oxide 23. |
| 10 | 12 | Form silicon nitride 18. |
| 11 | 12 | Develop contact cuts. |
| 11.1 | | Delineate photoresist mask. |
| 11.2 | | Etch FET and polysilicon contact cuts in nitride, then oxide. |
| 12 | 13 | Metallization. |
| 12.1 | | Deposit metal. |
| 12.2 | | Delineate photoresist mask. |
| 12.3 | | Pattern metal. |

Figure 1:
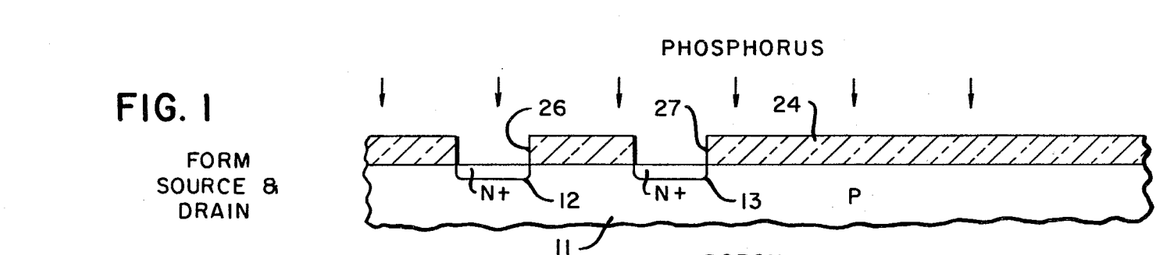
FIGS. 1–13 are cross-sectional representations of the sequential stages of fabricating an MNOS circuit using the process of the present invention.

As indicated in the Table, initially the source 12 and drain 13 are formed in the substrate 11 (step 1, FIG. 1). The implant or diffusion masking oxide layer 24 is grown to a typical thickness of 1,000-1,500 Angstroms (0.1-0.15 microns; step 1.1). The thickness is selected to prevent drive-in of impurities into the masked areas of the substrate during the subsequent source and drain formation. One suitable technique is to steam-grow the oxide. Other techniques include growth in dry oxygen, pyrolitic decomposition, and plasma deposition. A photoresist mask (not shown) is then applied to the oxide layer 24 (step 1.2) for use in delineating source and drain windows in the oxide layer. Using conventional photolithographic techniques and positive or negative photoresist, the photoresist typically is sprayed or spun onto the oxide, dried, masked or alter the solubility in developer of exposed areas, exposed to ultraviolet light, then developed. For positive photoresist, the exposed areas correspond to the source and drain windows, exposure increases the solubility of the exposed areas, and subsequent developing removes the exposed areas. For negative photoresist, the masked areas correspond to the source and drain windows, exposure decreases the solubility of the exposed areas, and subsequent developing removes the masked areas.

Source and drain windows 26 and 27 are then formed in the oxide masking layer 24 by etching via the photoresist mask using any of numerous conventional techniques such as liquid bath etching (step 1.3). One suitable etchant is a buffered hydrofluoric acid mixture of hydrofluoric acid and ammonium fluoride. The photoresist then may be stripped from the oxide masking layer 24 (step 1.4) and the substrate may be doped via the oxide windows using implantation or diffusion of N-type impurities such as phosphorus (step 1.5). Diffusion is preferred. In a typical diffusion process, oxygen is bubbled through $POCl_3$ at, e.g., 900° C. to form a phosphorus-doped oxide layer, then phosphorus is diffused or driven-in to the desired junction depth, $x_j$, using a drive-in temperature of, e.g., 925° C. A typical diffusion process results in junction depth of about one micron and a concentration of about $10^{19}$ atoms of phosphorus per cubic centimeter. The deposition provides heavily doped N+ regions which will serve as the source 12 and drain 13 of FET 20.

The oxide masking layer 24 is now removed (step 1.6) using a conventional etchant such as buffered hydrofluoric acid.

A field area implant (step 2, FIG. 2) is initiated by growing or depositing a layer 28 of silicon dioxide on the substrate 11 (step 2.1). The oxide layer 28 (typically 450 A° thick) serves as a "semi-barrier" to control the amount of, and penetration depth of, the field implant reaching the silicon substrate. A thicker or thinner oxide layer 28 will serve, as long as the field important energy is increased or decreased accordingly. As in the previous oxide formation, the layer 28 may be grown by any of the conventional techniques.

Figure 2:
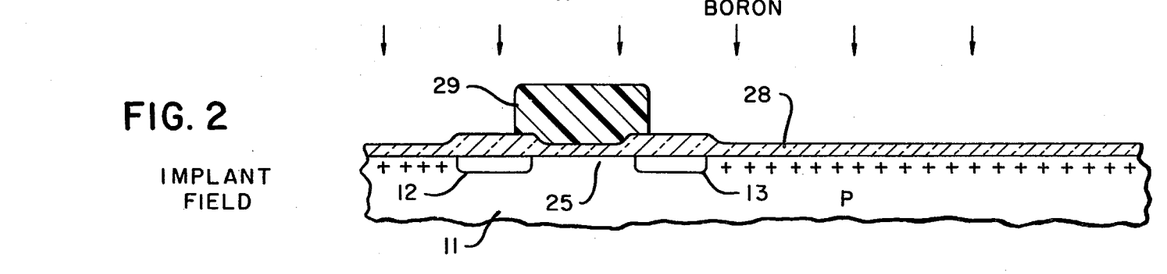

Next, channel-protecting photoresist mask 29 is formed by conventional photolithographic techniques (step 2.2), then the field regions of the device are heavily implanted (step 2.3) to make these regions more strongly P-type and to thereby eliminate field parasitic device action. This may be done by implantation of boron ions using an energy of 30 keV and a dose of $3 \times 10^{12}/cm^2$. As shown in FIG. 2, the photoresist mask 29 prevents implantation of the FET channel 25 during the field implant step. After the implant is completed, the photoresist mask 29 is stripped (step 2.4) using conventional techniques.

Figure 3:
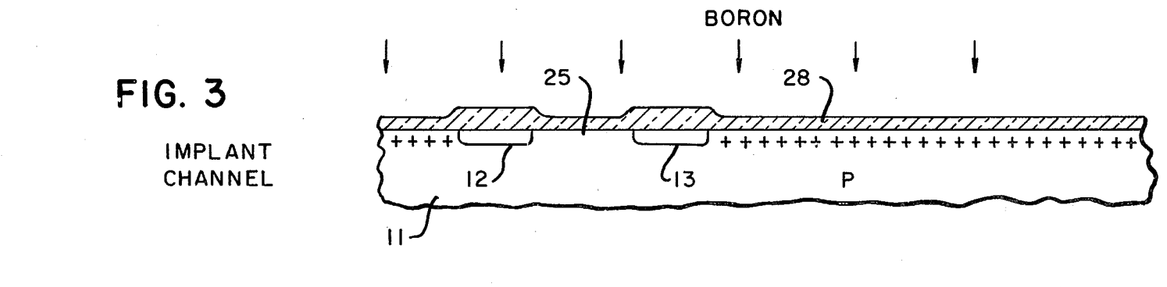

The gate (channel) area 25 is now subjected to an enhancement-type doping process (step 3, FIG. 3). This may be done by implantation of boron ions using an energy of 30 keV and a dose of $5 \times 10^{11}/cm^2$ to deposit a peak concentration of about $10^{16}/cm^3$ boron (step 3.1). After the ion implant, the oxide layer 28 is removed using conventional techniques such as etching in buffered hydrofluoric acid (step 3.2).

Figure 4:
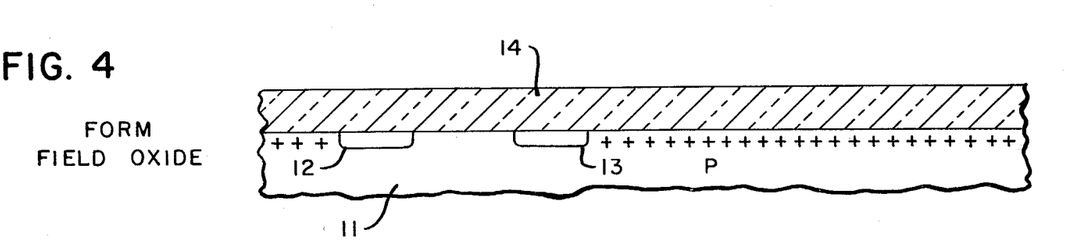

In step 4, (FIG. 4), the thick field oxide layer 14 is formed using conventional techniques such as pyrolytic decomposition.

Next, the polysilicon components are formed (step 5). This step is crucial, for the dimensions of the polysilicon components are tailored to provide the desired polysilicon resistance after the FET threshold implant in step 8. That is, the length 1, and the cross-sectional area, A, of various polysilicon regions are formed to predetermined dimensions to provide a predetermined resistance, R, wherein R=p1/A. Here, p is the resistivity of the polysilicon and is determined by the concentration of implanted impurities resulting from the FET threshold implant in step 8. In short, the dimensions of the polysilicon are established, as required, in step 5 so that the threshold voltage-determining implant of step 8 can also be used to simultaneously implant the polysilicon and thereby provide the desired resistance in polysilicon regions such as the body of resistor 42 and/or conductor 43.

It should be noted that the resistor contact resistance and conductor contact resistance are not determined by R=p1/A, but rather by the type of alloying action that occurs between the metal and the polysilicon. Some of the metal electrode atoms must migrate into the polysilicon and vice-versa in order to form a low-resistance contact. In addition, the formation of a p-n junction must be avoided. If, for example, aluminum is used for the metal electrode, it will act as a p-type dopant when it migrates into the polysilicon. In order to prevent the formation of a p-n junction in the silicon, the polysilicon in the contact region must have been previously doped either (1) p-type or (2) heavily-enough n-type so that the p-type doping due to the presence of aluminum in polysilicon is entirely cancelled.

Figure 5:
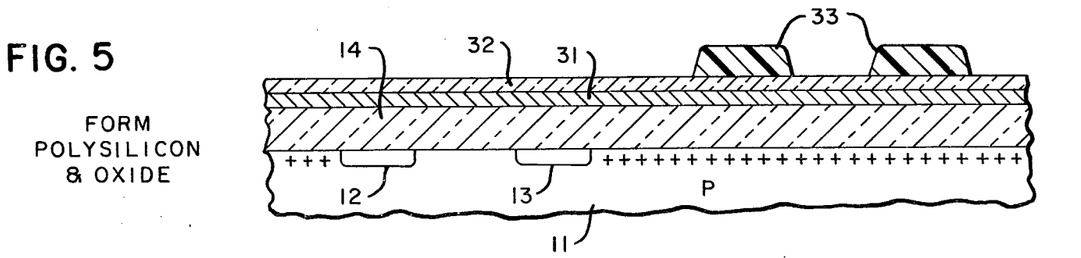
Figure 6:
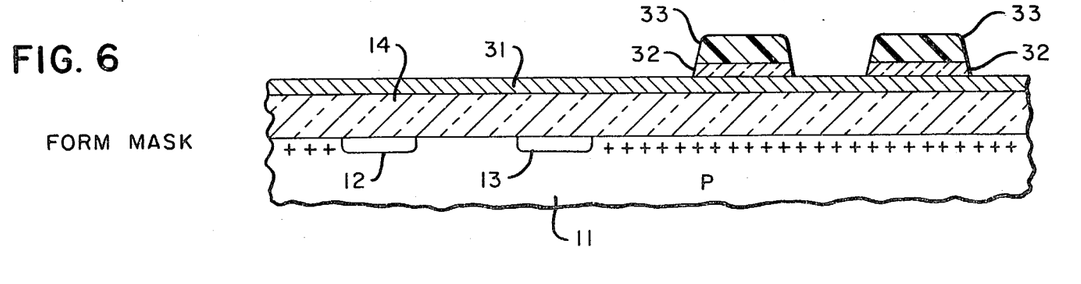
Figure 7:
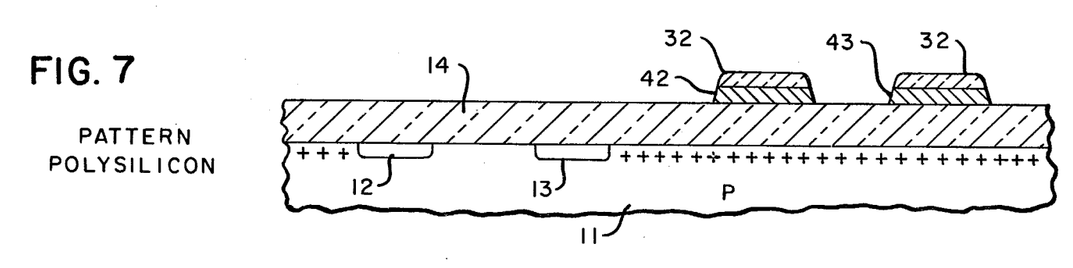
Figure 8:
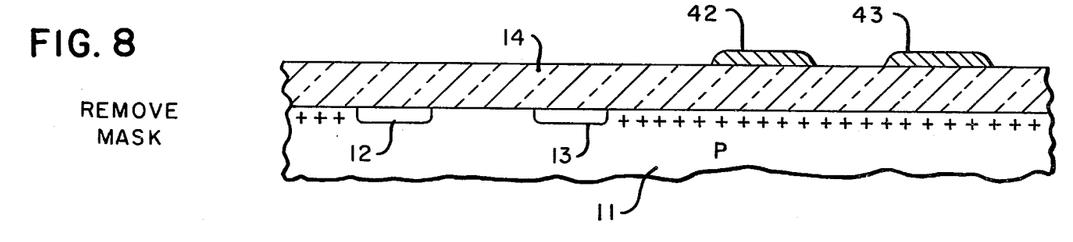

The polysilicon components are formed by depositing a layer of polysilicon 31 to the desired thickness, t, to provide the predetermined cross-sectional area A (step 5.1, FIG. 5) using conventional techniques such as pyrolysis of silane ($SiH_4$). A silicon oxide layer 32 is then grown on the polysilicon 31 (step 5.2, FIG. 5) using one of the conventional techniques discussed relative to steps 1.1. Then, the conventional photolithographic techniques are used to delineate the photoresist mask 33 (step 5.3, FIG. 5). The oxide mask 32 is next patterned via the photoresist mask 33 using, e.g., hot phosphoric acid etchant (step 5.4, FIG. 6). The photoresist mask 33 is now removed (step 5.5) and a selective etchant, such as a mixture of hydrochloric, nitric, and acetic acids, is applied to the polysilicon layer 31 via the oxide mask 32 to form the polysilicon, including the resistor 42 and conductor 43 (step 5.6, FIG. 7). This polysilicon formation step establishes the width, w, of the various polysilicon regions and, thus, establishes the predetermined cross-sectional areas according to A=tw. Finally, the oxide mask 32 is removed (step 5.7, FIG. 8), as by etching in the aforementioned hydrochloric-nitric-acetic acid mixture.

Figure 9:
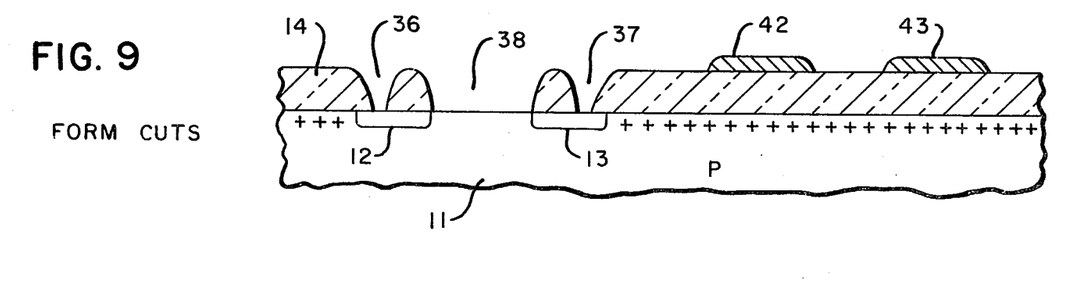

In step 6 (FIG. 9), source contact cut, gate cut, and drain contact cut 36, 37, and 38, respectively, are formed in the field oxide 14 by delineating a photoresist mask (step 6.1), and etching the cuts (apertures or windows) in the field oxide 14 via this mask (step 6.2). The purpose of this step is to define the areas for the gate dielectric and to decrease the amount of etching required in the source and drain contact areas during the later contact etch.

Figure 10:
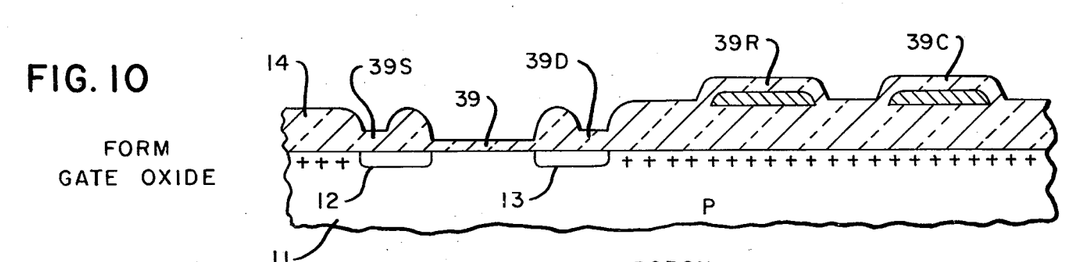

In step 7 (FIG. 10), gate oxide 39 is formed on the substrate 11 within the gate window 38. The gate oxide is formed about 400 to 500 Angstroms (0.04 to 0.05 microns) thick, using one of the conventional growth and deposition processes mentioned pursuant to step 1.1. Because it is usually desirable that the gate oxide be dense and of high quality, a process such as dry thermal oxidation is preferred. As shown in FIG. 10, the gate oxide growth process simultaneously and incidentally forms oxide layers 39C and 39R over the polysilicon conductor and resistor components, and oxide 39S and 39D within the windows 36 and 37 over the highly doped source and drain.

Figure 11:
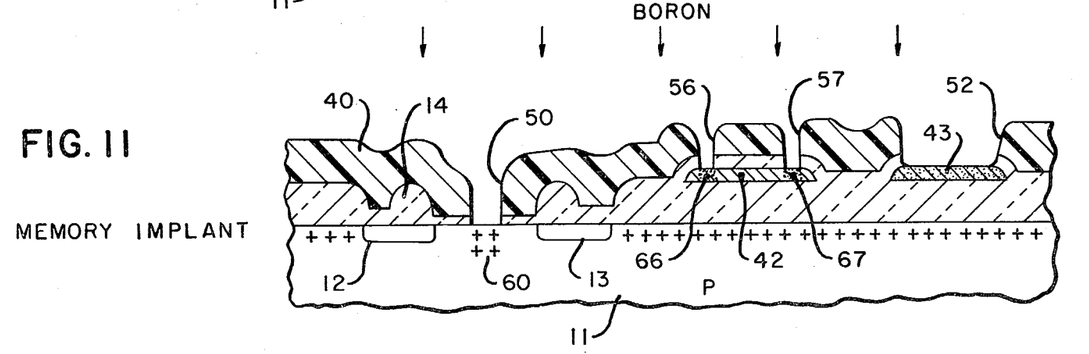

In step 8, (FIG. 11) the gate and polysilicon components are implanted. First, a photoresist mask 40 is formed (step 8.1) having deposition windows 50, 56, 57, and 52 corresponding, respectively, to the memory gate region 60 of FET channel 25, the contact regions 66 and 67 of the polysilicon resistor 42, and the conductor 43. The oxide resulting from the gate oxide formation is etched from beneath these windows (step 8.2). Then, P-type ions such as boron are implanted via the mask 40 to the required concentration to establish the desired value of the threshold voltage of the FET (step 8.3). As described relative to step 5, the length 1 and cross-sectional area A of the polysilicon body of conductor 43 were tailored so that this threshold voltage-determining implant concentration also gives the desired resistance value(s). A typical boron implantation utilizes 30 keV energy and a dose of $5 \times 10^{12}/cm^2$. (The 1 and A of resistor 42 are also tailored to give the desired resistance value(s), but the resistor body provides this resistance without being implanted in step 8.3). Photoresist mask 40 is now removed (step 8.4).

In step 9 (FIG. 12), the 10–60 A° (.0010 to 0.006 microns) thick memory oxide 23 is grown within window 50. This oxide is preferably dense and of high quality. The comments regarding forming gate oxide 39, step 7, apply here. Note that the memory oxide growth forms an additional 10–60 A° of oxide over the non-memory oxide 39. This additional thickness normally is insignificant. However, if desired, the thickness of the non-memory oxide 39 (step 7) can be adjusted to allow for the additional thickness.

In step 10 (FIG. 12) silicon nitride layer 18 is formed over the top surface of the partially completed wafer. One suitable process is chemical vapor deposition using silane and ammonia reactants.

Figure 12:
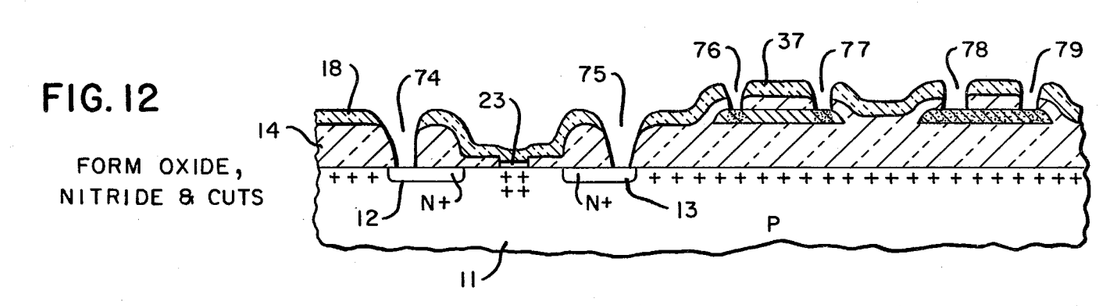

Next, contact cuts are etched (step 11, FIG. 12). First, a photoresist mask (not shown) is formed over the silicon nitride 18 (step 11.1). Then, contact windows 74 and 75 for the source and drain of FET 20 and contact windows 76–79 for the polysilicon components are etched (1) in the nitride via the photoresist mask using hot phosphoric acid, then (2) in the underlying silicon oxide via the patterned nitride using a conventional etchant such as buffered hydrofluoric acid (step 11.2).

Metal conductors 44, 45, 46, 47, 48 and 49 are then connected through the contact windows to the source and drain of FET 20 and to the polysilicon components (step 12, FIG. 13). First, a layer of metal such as aluminum or aluminum-silicon alloy is formed on the nitride to a thickness of 10,000 to 15,000 Angstroms (1 to 1.5 microns) using a conventional technique such as vacuum evaporation (step 12.1). A photoresist mask (not shown) is formed to delineate the desired metal conductor pattern (step 12.2). The metal contacts and interconnects such as 44, 45, 46, 47, 48 and 49 are then formed by etching the metal layer via the photoresist mask. Finally, a passivation layer (or layers) may be formed over the circuit.

It will be appreciated that an anneal or subsequent high temperature process steps may be used, as desired, to repair any structural damage caused by ion implantation and to activate the implanted species.

The above discussion refers to doping the resistor contacts and the conductor body. Those skilled in the art will readily appreciate that both the resistor body and the conductor body can be doped. That is, the size of the resistor(s) as well as that of the conductor(s) can be adjusted to the memory doping level, and the memory threshold doping then used to implant the resistor body and the conductor body and thereby to simultaneously establish a resistance of the conductor and the resistor. Of course, various combinations of implanted and unimplanted polysilicon components, and contact-implants only and body implants are readily implemented.

The above-described process is applicable to split-gate structures, as well as to tri-gate structures. For example, the split-gate memory MNOS structure taught in U.S. Pat. No. 3,719,866 is easily obtained by extending the memory windows 60 (steps 8.1 and 8.2, FIG. 11) over the left or right side of the channel adjacent the source or drain; implanting via this memory window; and then forming the thin memory oxide within the window as described above.

Similarly, a "pure" memory structure is obtained by forming the memory window 60 to span the length of the channel so that the thin memory oxide 23 spans the channel and both thick oxide regions 21 and 22 are eliminated.

The formation of non-memory channels (or channel sections) and memory channels is not limited to memory and non-memory sections of a single transistor, for separate non-memory transistors can be formed simultaneously with memory transistors. This is because, in forming non-memory channel sections, the above-described process contains all the steps necessary to form separate, non-memory transistors simultaneously with memory transistors, including split-gate, tri-gate and pure memory structures.

To illustrate, the source and drain of the non-memory FET are formed along with the memory FET source and drain in step 1 (FIG. 1). The initial channel implant of step 3 (FIG. 3), hereafter the "base" implant, is used to establish the threshold voltage of the non-memory FET(s) as well as the threshold voltage of any non-memory sections of the memory FETs. The polysilicon component formation of step 5 and the memory implant of step 8 are then tailored to this base implant and provide the required memory channel threshold voltage and polysilicon component resistance. The field oxide gate window etch and the gate oxide of the non-memory FET are formed in steps 6 and 7 (FIGS. 9 and 10) along with the window and oxide of any non-memory sections of the memory FETs. The gate oxide of the non-memory FET is protected by the photoresist mask of step 8.1 (FIG. 11) so that the gate is shielded from the etching of step 8.2 and from the second, memory implant of step 8.3. Nitridization, contact cuts, metalization, and a passivation layer or layers are applied simultaneously to the non-memory and memory FETs.

EXAMPLE

The process can be used to form on the same chip a trigate memory FET 20 having a memory threshold (erased) of 1.2 volts, and a polysilicon resistor 42 having a resistance of about 10 megohms and contact resistance of less than one megohm. The substrate is a p-type silicon wafer of 5 to 9 ohm-cm resistivity. After the appropriate masking steps, as described above, the source 12 and drain 13 are formed, by diffusion, by bubbling oxygen through $POCl_3$ at about 900° C. to form phosphorus-doped oxide "predeposition" layers over the source and drain regions, then driving in the phosphorus by applying a temperature of about 925° C. for about 30 minutes. This provides a source and drain of about $10^{19}/cm^3$ concentration and a junction depth of about one micron. Oxide mask 24 is now stripped.

Next, oxide masking layer 28 is grown to a thickness of 450° A and the channel is covered with a protective layer of photoresist 29. The field regions of the circuit 10 are implanted with boron using 30 KeV and a dose of about $3 \times 10^{12}/cm^2$. Then, photoresist 29 is stripped and a relatively light boron gate implant is performed using 30 KeV and a dose of about $5 \times 10^{11}/cm^2$. The implant adjusts the threshold of the non-memory sections of the channel. After removing the oxide layer 28, the field oxide is formed 10,000 Angstroms thick (about one micron) using chemical vapor deposition.

The polysilicon layer 31 is deposited to a thickness of 5,000 Angstroms using pyrolysis of silane, at 700° C. and 1 atm. pressure. The polysilicon resistor is patterned using a single-mask etching sequence. The polysilicon resistor 42 is formed to a length, 1, (between contacts 66 and 67) of 10 microns and a cross-sectional area A (between the contacts) of 100 square microns to provide 100 megohms resistance. The contact regions 66 and 67 of the resistor are 3 microns×3 microns and provide less than one megohm resistance after the threshold-adjusting boron implant.

Next, the initial source, drain and gate cuts are made in the field oxide 14. The gate cut defines the channel region of the FET 20. The aforementioned oxide process is used to grow the non-memory gate oxide 39 about 450 Angstroms thick spanning the length of the channel. The memory mask 40 is formed and the oxide is etched from within the mask windows to expose the memory section of the channel and the resistor contact regions. (The resistor body is not implanted). Boron implantation is done using an implant energy of 30 keV and a dose of $5 \times 10^{12}/cm^2$ to simultaneously adjust the threshold of the memory section 60 of the FET to 1.2 volts (erased) and adjust the resistivity of the polysilicon contact regions to $2 \times 10^9$ ohms per square.

The memory oxide 23 is then formed 20 Angstroms thick ($2 \times 10^{-3}$ micron) using the aforementioned wet oxide process. Silicon nitride is deposited 350 Angstroms thick ($35 \times 10^{-2}$ micron) over the circuit 10. The final source and drain contact cuts and the polysilicon contact cuts are etched in the silicon nitride layer 18 using hot phosphoric acid and in the silicon dioxide layer using a 10:1 mixture by volume of deionized water and hydrofluoric acid.

Aluminum metallization is formed 14,000 Angstroms thick (1.4 microns) by vacuum evaporation and is etched to shape in a 60:10:1:7 mixture by volume of phosphoric acid, acetic acid, nitric acid and deionized water. Finally, a silicon dioxide passivation layer 12,000 Angstroms thick (1.2 microns) is formed over the circuit by chemical vapor deposition.

The simultaneous memory gate-polysilicon implant adjusts the FET 20 threshold to 1.2 volts (erased), provides the desired low contact resistance (<1 Megohm) and prevents the formation of pn junctions between the polysilicon and the later-formed aluminum metalization.

The above example uses a gate (channel) doping level, $5 \times 10^{11}/cm^2$ that would require relatively large conductors. However, the doping level can be increased to reduce the conductor size.

Thus, there has been described a method for simultaneously adjusting the threshold of field-effect transistors and the resistance of polysilicon components such as resistors, conductors, and contact regions by doping the FET channel and polysilicon regions to provide the desired threshold voltage after having tailored the geometry of the polysilicon components to the threshold-determining implant concentration. The process is applicable to CIS technology in general, and to pure memory, split gate and trigate memory structures, to combinations of these with non-memory transistors, and to single layer gate dielectric and multiple layer gate dielectric structures.

U.S. Ser. No. 962,422, which is based upon NCR Docket 2778, filed the same date as the present application, and assigned to NCR, teaches a process which uses a simultaneous channel and polysilicon implant to form non-memory CISFETs and polysilicon components. This application is incorporated by reference. Essentially, the base implant (FIG. 3) and the memory window 50 and memory implant (FIG. 11) are not used. Instead, at the process stage illustrated in FIG. 9, a single mask is used for etching the source and drain contact cuts and the gate cut and for implanting the channel and the polysilicon components. After the polysilicon formation, the non-memory gate oxide is formed as shown in FIG. 10. Next, at the stage of processing shown in FIG. 12, growth of the memory oxide 23 is omitted, because the non-memory gate oxide 39 (FIG. 10) is to be left spanning the channel. Formation of nitride layer 18 is optional (step 10), and where the nitride is omitted, only the conductor contact cuts are formed here (step 11). Then, the non-memory FET is completed by forming the gate electrode and other conductors (step 12) and any passivation layer(s).

It should be noted that FIG. 13 refers to metalization and the exemplary process refers to the use of aluminum or aluminum-silicon alloy for the gate electrode and other conductors. The term metalization in FIG. 13 and elsewhere includes gate conductors generally, and thus refers to conductors such as polysilicon as well as to conventional-metal conductors such as aluminum and aluminum-silicon.

Finally, as used here, good memory characteristics and the term gate "memory dielectric" or gate "memory insulator" imply a high concentration of charge trapping centers and relative ease of charge transfer between the charge-storing dielectric and, e.g., the substrate. As used here, "non-memory dielectric" or "non-memory insulator" includes a single layer (or multiple layers) which has a low concentration of charge trapping centers and/or poor charge transfer characteristics and also multiple layers, such as the oxide and nitride layers of MNOS, in which an intervening non-memory material (oxide) is sufficiently thick to prevent, or otherwise prevents charge transfer between the memory dielectric (nitride) and the substrate.

Having described a preferred embodiment of, and examples of the process which incorporate the invention, what is claimed is:

1. In a process for forming an integrated circuit including at least a memory field effect transistor having a channel memory section and at least a polysilicon component on a semiconductor substrate and wherein the memory threshold voltage of the field effect transistor and the resistance of the polysilicon component are determined by the impurity concentration therein, the improvement wherein, prior to forming the transistor gate electrode and circuit interconnections, the memory threshold voltage-determining concentration and the resistance-determining impurity concentration of at least a portion of the polysilicon component are established simultaneously in the partially completed integrated circuit which comprises the substrate having a source and drain formed therein and field insulation formed selectively thereon, by:

forming a layer of polysilicon on the field insulation in a predetermined pattern of at least one component, the size and geometry of the component being selected to provide a given resistance for a given impurity concentration therein;

forming an aperture in the insulating oxide over the location of the transistor channel;

forming a non-memory gate insulator over the transistor channel;

selectively implanting impurities in the channel memory section and in the polysilicon component to establish the given memory threshold voltage-determining and resistance-determining impurity concentration in the channel and in at least the portion of the polysilicon component; and selectively forming a memory gate insulator over the memory channel section.

2. In a process for forming an integrated circuit including at least one CIS memory field effect transistor, the transistor channel having a memory section and at least a non-memory section adjacent one of the source or the drain, and a polysilicon component on a semiconductor substrate, and wherein the threshold voltage of the transistor channel and the resistance of at least a section of the polysilicon components are established by the impurity concentration therein, the improvement wherein the threshold voltage-determining impurity concentration of the memory channel section and the polysilicon resistance-determining impurity concentration are established simultaneously in the partially processed integrated circuit comprising the substrate having a source and drain formed therein and insulating oxide formed selectively thereon and prior to forming the transistor gate electrode, by:

forming a layer of polysilicon on the partially processed integrated circuit in a predetermined pattern of at least one passive component, the geometry of the component being selected to provide the predetermined conductivity for a given impurity concentration therein;

forming an aperture in the insulative oxide over the location of the transistor channel;

forming a gate oxide layer of non-memory thickness on the substrate within the channel aperture;

forming a mask over the integrated circuit to selectively define the memory section of the channel and an implant section of the polysilicon component;

etching the gate oxide layer via the mask to expose the memory section of the channel and the implant section of polysilicon component;

selectively implanting impurities via the mask in the exposed memory section of the channel and in the exposed polysilicon component implant section sufficient to establish the given threshold voltage-determining and conductivity-determining impurity concentration in the memory section of the channel and in the polysilicon component;

forming a gate oxide layer of memory thickness over the memory section of the channel; and forming a layer of silicon nitride over at least the channel of the field effect transistor.

3. The improved process of claim 2, further comprising after the step of forming the source and drain and prior to forming the polysilicon layer:

selectively doping the substrate to control parasitic conduction; and doping the channel to establish a base impurity concentration therein; and wherein the implanting step adjusts the impurity concentration in the channel memory section to the given threshold voltage-determining concentration.

4. In a process for forming an integrated circuit comprising at least a memory CIS field effect transistor having a memory channel section and at least a non-memory channel section adjacent one of the source and drain, and a polysilicon component on a semiconductor substrate, the improvement wherein a given threshold voltage-determining impurity concentration associated with the memory channel section and a given resistance-determining impurity concentration of the polysilicon component are established simultaneously, the improvement comprising:

forming a source and drain in the semiconductor substrate;

selectively doping areas of the substrate to control parasitic conduction;

doping the transistor channel to establish a base impurity concentration for providing a given non-memory section threshold voltage;

selectively forming a layer of field oxide on the substrate;

forming a polysilicon layer in a predetermined pattern comprising at least one passive component, the geometry thereof being selected to provide the given resistance for a given impurity concentration;

forming an aperture in the field oxide defining the channel;

forming a relatively thick, charge transfer-preventing, non-memory gate oxide layer over the channel within the channel aperture;

removing the relatively thick gate oxide over the memory channel section;

selectively ion implanting the integrated circuit to establish the given impurity concentration in the memory channel section and the given polysilicon component impurity concentration;

forming a relatively thin, charge transferpermitting, memory gate oxide layer over the memory section of the channel;

forming a layer of charge storage dielectric material over the channel and selectively forming a transistor gate electrode and interconnections to the source, drain, and polysilicon component.

5. The process of claim 4 wherein the gate electrode is metal, metal alloy, or polysilicon.

6. The process of claim 4, wherein the charge storage dielectric material is silicon nitride.

7. The process of claims 2, 3 or 4 wherein the memory transistor channel comprises a memory section flanked by a pair of non-memory sections, one non-memory section being adjacent the source and the other non-memory section being adjacent the drain.

8. The process of claims 2, 3, or 4 wherein the memory transistor channel comprises a memory section and an adjacent non-memory section.

9. The improved process of claim 4, wherein the integrated circuit also comprises at least one non-memory field effect transistor, and wherein the gate oxide of the non-memory transistor is formed by the step of forming the non-memory gate oxide and the threshold voltage of the non-memory transistor is established by the base channel doping step.

10. The improved process of claim 9, wherein the memory transistor channel comprises a memory section flanked by a pair of non-memory sections, one non-memory section being adjacent the source and the other non-memory section being adjacent the drain.

11. The improved process of claim 9 wherein the memory transistor comprises a memory section and an adjacent non-memory section.

12. In a process for forming an integrated circuit comprising a field effect transistor having a channel memory section and a polysilicon component on a semiconductor substrate, the improvement wherein a memory threshold voltage-determining dopant concentration and a resistance-determining dopant concentration are established simultaneously in the partially completed integrated circuit which comprises the substrate having field insulation formed thereon, by:

forming a polysilicon component on the field insulation, the size of the component being selected to provide a given resistance for a given impurity concentration therein;

forming a window in the insulating oxide over the substrate location of the transistor channel;

forming a non-memory gate insulator within the window;

simultaneously implanting impurities in the channel memory section and in the polysilicon component to establish the memory threshold voltage-determining dopant concentration and resistance-determining dopant concentration; and forming a memory gate insulator over the channel memory section.

* * * * *